(12) United States Patent
Willassen (10) Patent No.: US 8,604,407 B2
(45) Date of Patent: Dec. 10, 2013

(54) DUAL CONVERSION GAIN PIXEL METHODS, SYSTEMS, AND APPARATUS

(75) Inventor: Trygve Willassen, Oppegaard (NO)

(73) Assignee: Aptina Imaging Corporation, George Town (KY)

( * ) Notice: Subject to any disclaimer, the term of this patent is extended or adjusted under 35 U.S.C. 154(b) by 338 days.

(21) Appl. No.: 13/175,103

(22) Filed: Jul. 1, 2011

(65) Prior Publication Data

US 2012/0273651 A1    Nov. 1, 2012

Related U.S. Application Data

(60) Provisional application No. 61/480,575, filed on Apr. 29, 2011.

(51) Int. Cl.
*H01L 27/00*    (2006.01)
*H04N 3/14*    (2006.01)

(52) U.S. Cl.
USPC ...................................... 250/208.1; 348/308

(58) Field of Classification Search
USPC ........................................ 250/208.1; 348/308
See application file for complete search history.

(56) References Cited

U.S. PATENT DOCUMENTS 8,299,513 B2 * 10/2012 Dai .............................. 257/292
2009/0096890 A1    4/2009 Li

* cited by examiner

*Primary Examiner* — Thanh Luu (57) ABSTRACT

Dual conversion gain pixel methods, system, and apparatus are disclosed. Dual conversion gain may be obtained by configuring an active pixel having a storage node, a first connection region, a second connection region, and a capacitor coupled between the storage node and the second connection region to introduce a first conversion gain by connecting the first connection region to a power source and connecting the second connection region to a current bias source and reconfiguring the active pixel to introduce a second conversion gain by connecting the second connection region to the power source and connecting the first connection region to the current bias source.

18 Claims, 9 Drawing Sheets

DUAL CONVERSION GAIN PIXEL METHODS, SYSTEMS, AND APPARATUS

CROSS REFERENCE TO RELATED APPLICATIONS

This application claims priority to U.S. Provisional Application Ser. No. 61/480,575, entitled DUAL CONVERSION GAIN BY SWAPPING PIXEL OUTPUT AND POWER SUPPLY CONNECTIONS, filed Apr. 29, 2011, the contents of which are incorporated fully herein by reference.

FIELD OF THE INVENTION

Embodiments described herein relate generally to semiconductors and more particularly to imaging device methods, systems, and apparatus.

BACKGROUND OF THE INVENTION

Many portable electronic devices, such as cameras, cellular telephones, Personal Digital Assistants (PDAs), MP3 players, computers, and other devices include a semiconductor (e.g., complementary metal-oxide-semiconductor; CMOS) imaging device for capturing images. An imaging device includes a focal plane array of pixels, each one of the pixels including a photosensor, for example, a photogate, photoconductor or a photodiode overlying a substrate for accumulating photo-generated charge in the underlying portion of the substrate. Each pixel has a readout circuit that includes an output transistor and a charge storage region connected to the gate of an output transistor. The charge storage region may be constructed as a floating diffusion region. Each pixel includes at least one electronic device such as a transistor for transferring charge from the photosensor to the storage region and one device, also typically a transistor, for resetting the storage region to a predetermined charge level prior to charge transference.

In a typical CMOS imaging device, the active elements of a pixel perform the functions of: (1) photon to charge conversion; (2) accumulation of image charge; (3) resetting the storage region to a known state; (4) transfer of charge to the storage region accompanied by charge amplification; (5) selection of a pixel for readout; and (6) output and amplification of a signal representing a reset level and pixel charge. Photon charge may be amplified when it moves from the initial charge accumulation region to the storage region. The charge at the storage region is typically converted to a pixel output voltage by an output transistor.

Figure 1:
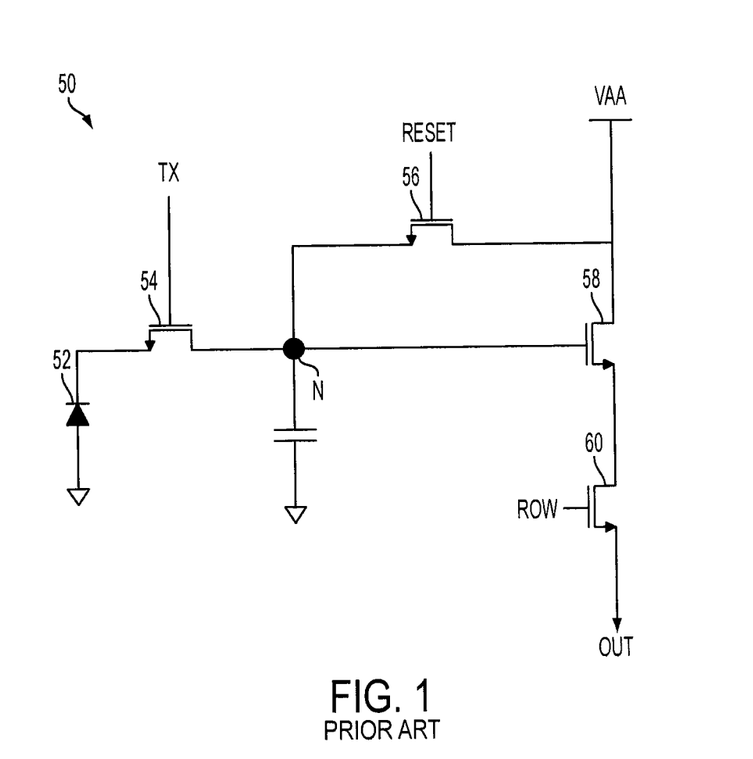
FIG. 1 is a circuit diagram illustrating a prior art four transistor pixel for use in an array of an imaging device.

FIG. 1 illustrates a typical four transistor (4T) pixel 50 utilized in a pixel array of an imaging device, such as a CMOS imaging device. The pixel 50 includes a photosensor 52 (e.g., a photodiode), a storage node N configured as a floating diffusion region, transfer transistor 54, reset transistor 56, charge conversion transistor 58 configured as a source follower transistor, and row select transistor 60. The photosensor 52 is connected to the storage node N by the transfer transistor 54 when the transfer transistor 54 is activated by a transfer control signal TX. The reset transistor 56 is connected between the storage node N and an array pixel supply voltage VAA. A reset control signal RESET is used to activate the reset transistor 56, which resets the storage node N to a known state as is known in the art.

The charge conversion transistor 58 has its gate connected to the storage node N and is connected between the array pixel supply voltage VAA and the row select transistor 60. The charge conversion transistor 58 converts the charge stored at the storage node N into an electrical output signal. The row select transistor 60 is controllable by a row select signal ROW for selectively outputting the output signal OUT from the charge conversion transistor 58. For each pixel 50, two output signals are conventionally generated, one being a reset signal Vrst generated after the storage node N is reset, the other being an image or photo signal Vsig generated after charges are transferred from the photosensor 52 to the storage node N.

Figure 2:
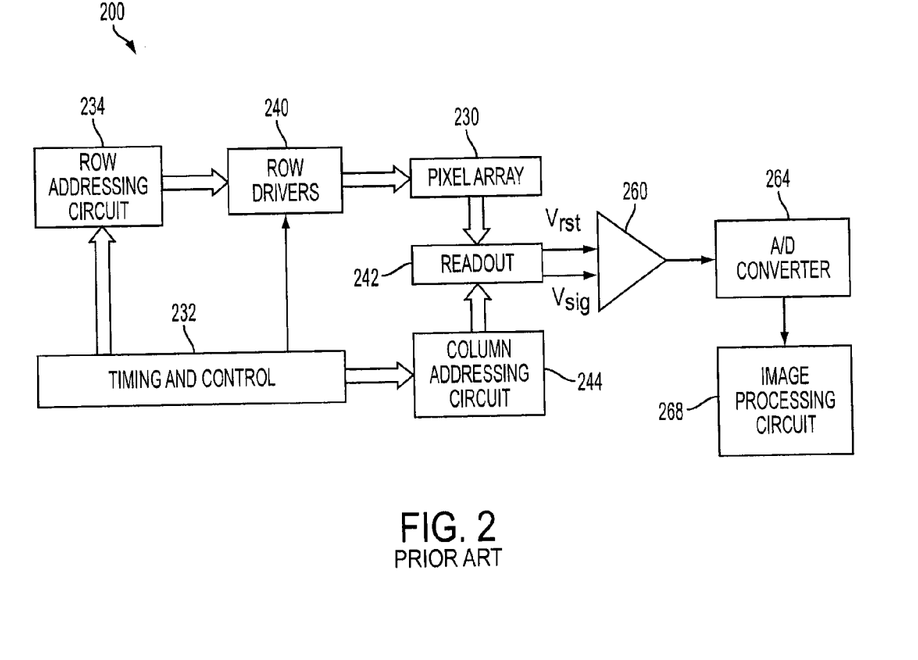
FIG. 2 is a block diagram of a prior art imaging device.

FIG. 2 shows an imaging device 200 that includes an array 230 of pixels (such as the pixel 50 illustrated in FIG. 1) and a timing and control circuit 232. The timing and control circuit 232 provides timing and control signals for enabling the reading out of signals from pixels of the pixel array 230 in a manner commonly known to those skilled in the art. The pixel array 230 has dimensions of M rows by N columns of pixels, with the size of the pixel array 230 depending on a particular application.

Signals from the imaging device 200 are typically read out a row at a time using a column parallel readout architecture. The timing and control circuit 232 selects a particular row of pixels in the pixel array 230 by controlling the operation of a row addressing circuit 234 and row drivers 240. Signals stored in the selected row of pixels are provided to a readout circuit 242 in the manner described above. The signals are read twice from each of the columns and then read out sequentially or in parallel using a column addressing circuit 244. The pixel signals (Vrst, Vsig) corresponding to the reset pixel signal and image pixel signal are provided as outputs of the readout circuit 242, and are typically subtracted by a differential amplifier 260 in a correlated double sampling operation and the result digitized by an analog to digital converter to provide a digital pixel signal. The digital pixel signals represent an image captured by pixel array 230 and then are processed in an image processing circuit 268 to provide an output image.

Many of the portable electronic devices that include a CMOS imaging device, e.g., cameras, cell phones, PDA, etc., are designed for operation in different levels of light. For example, a camera may include a first setting for use under low ambient light conditions and another setting for use under high ambient light conditions. Including circuitry in a CMOS imaging device for providing different levels of gain for handling different ambient light conditions increases the costs and materials required to manufacture the device.

DETAILED DESCRIPTION OF THE INVENTION

Figure 3:
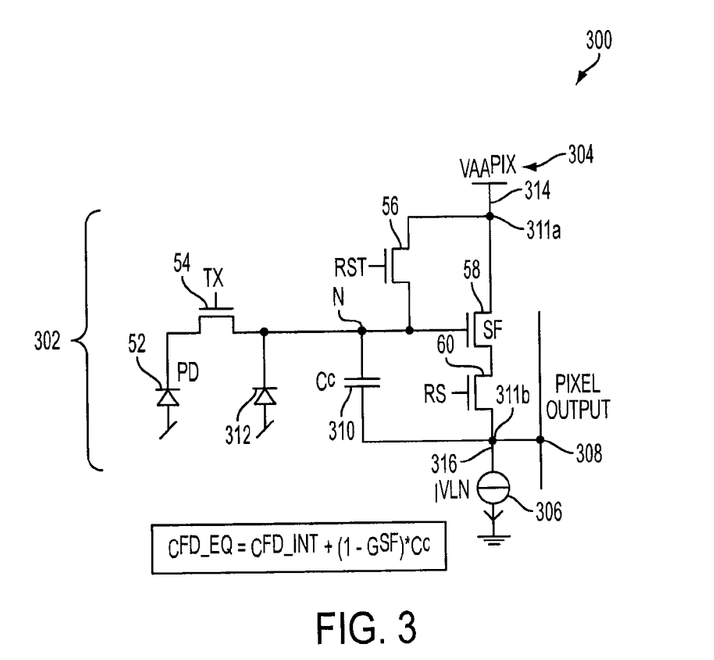
FIG. 3 is a circuit diagram of an active pixel configured for high conversion gain in accordance with an aspect of the present invention.

FIG. 3 depicts a circuit 300 configured to deliver a first conversion gain (e.g., high conversion gain) including an active pixel 302 that may be used in a pixel array of an imaging device, such as a CMOS imaging device. The active pixel 302 is coupled to a power source 304 ($VAA_{PIX}$) and a current bias source 306 ($I_{VLN}$). The pixel 302 includes a photosensor 52, a storage node N configured as a floating diffusion region, a transfer transistor 54, a reset transistor 56, a charge conversion transistor 58 (e.g., a source follower transistor), and a selection transistor 60 (e.g., a row select transistor). The photosensor 52 is connected to the storage node N by the transfer transistor 54 when the transfer transistor 54 is activated by a transfer control signal TX. The reset transistor 56 is connected between the storage node N and the power source 304. A reset control signal RESET is used to activate the reset transistor 56, which resets the storage node N to a known state as is known in the art.

The charge conversion transistor 58 has its gate connected to the storage node N and is connected between the power source 304 and the row select transistor 60. The charge conversion transistor 58 converts the charge stored at the storage node N into an electrical output signal. The row select transistor 60 is controllable by a row select signal ROW for selectively outputting the output signal OUT from the charge conversion transistor 58.

The pixel 302 additionally includes a capacitor 310, a first connection region 311a, a second connection region 311b, and a diode 312. The charge conversion transistor 58 and the selection transistor 60 are connected in series between the first and second connection regions 311a, b. In FIG. 3, the first connection region 311a is coupled to the power source 304 via connection 314 and the second connection region 311b is coupled to the current bias source 306 via connection 316. The capacitor 310 is coupled between the floating diffusion region and the second connection region.

Figure 4:
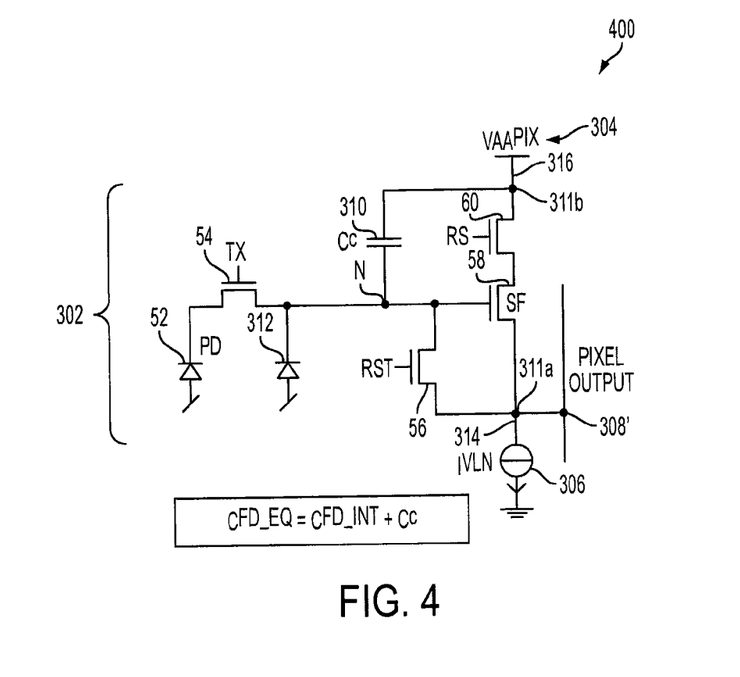
FIG. 4 is a circuit diagram of an active pixel configured for low conversion gain in accordance with an aspect of the present invention.

FIG. 4 depicts a circuit 400 configured to deliver a second conversion gain (e.g., low conversion gain) including the active pixel 302, the power source 304 ($VAA_{PIX}$) and the current bias source 306 ($I_{VLN}$). In FIG. 4, the first connection region 311a is coupled to the current bias source 306 via connection 314 and the second connection region 311b is coupled to the power source 304 via connection 316. As in FIG. 3, in FIG. 4, the capacitor 310 is coupled between the storage node N and the second connection region 311b.

Figure 3A:
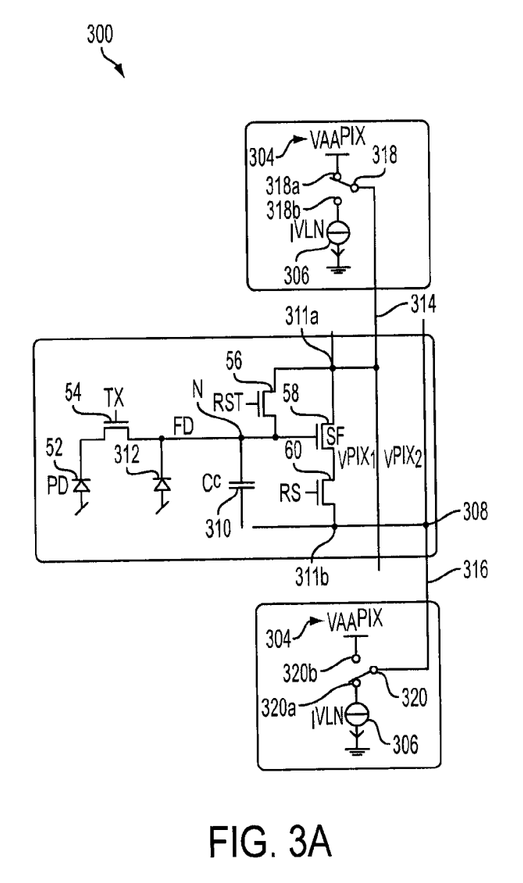
FIG. 3A is a circuit diagram illustrating the active pixel of FIG. 3 with configuration circuitry.
Figure 3B:
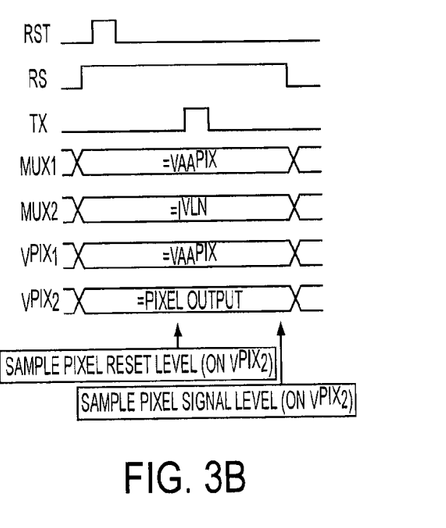
FIG. 3B is a timing diagram for the active pixel and configuration circuitry in FIG. 3A.
Figure 4A:
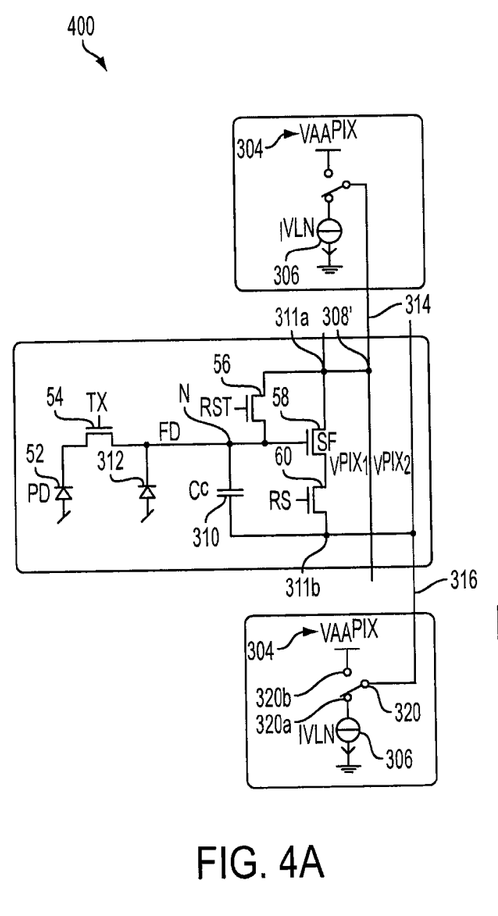
FIG. 4A is a circuit diagram illustrating the active pixel of FIG. 4 with configuration circuitry.
Figure 4B:
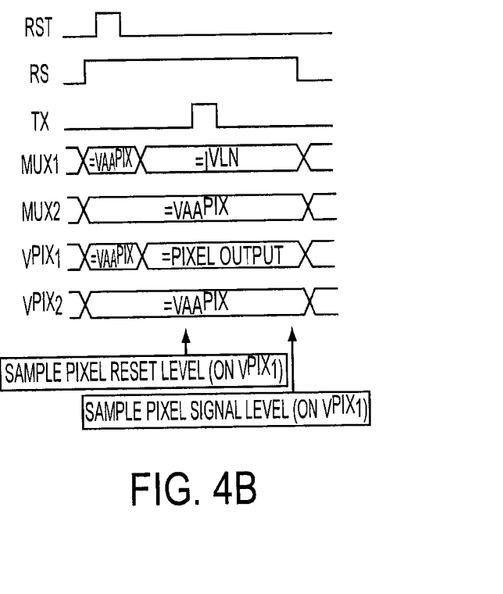
FIG. 4B is a timing diagram for the active pixel and configuration circuitry in FIG. 4A.

FIGS. 3A and 4A depict an embodiment of circuit 302 (FIG. 3) respectively introducing a first conversion gain when configured as circuit 300 and introducing a second conversion gain when configured as circuit 400. FIG. 3B depicts a timing diagram for introducing the first conversion gain when configured as circuit 300 and FIG. 4B depicts a timing diagram for introducing the second conversion gain when configured as circuit 400.

The circuits 300, 400 include a first switch 318 and a second switch 320. The first switch 318 couples the first connection region 311a to the power source 304 when the switch 318 is in a first position 318a (as illustrated in FIG. 3A) and to the current bias source 306 when the switch 318 is in a second position 318b (as illustrated in FIG. 4A). The second switch 320 couples the second connection region 311b to the current bias source 306 when the switch 320 is in a first position 320a (as illustrated in FIG. 3A) and to the power source 304 when the switch 320 is in a second position 320b (as illustrated in FIG. 4A). Thus, circuit 300 can be transformed into circuit 400 by changing the positions of the first and second switches. The switches 318, 320 may be implemented using a multiplexer. Suitable switches/multiplexers will be understood by one of skill in the art from the description herein.

The switches 318, 320 are coupled to the connection regions 311a, 311b via connections 314, 316, respectively. The connections 314, 316 may be conventional metal traces within a semiconductor pixel array. In a typical semiconductor pixel array, a pair of metal traces extend through each pixel in a column within the array (e.g., a first trace is connected to power source 304 to supply power to each pixel in the column and a second trace is connected to the current bias source 306 to obtain an output signal). In an embodiment, these traces are coupled to the switches 318, 320 to enable connection of each pixel in the column to either voltage source 304 or current bias source 306.

A timing embodiment for configuring circuit 302 to introduce a high-conversion gain (FIG. 3B) starts with setting the switches 318, 320 (e.g., switch 318 set in a first position to connect power source 304 to first connection region via a first semiconductor trace (VPIX1) and switch 320 set in a first position to connect current bias source 306 to a second connection region via a second semiconductor trace (VPIX2)). In this configuration, the pixel output will be present on the second semiconductor trace. The selection transistor 60 is then activated with a row selection (RS) signal being set to a high value. A reset pulse (RST) is then applied to the reset transistor 56. A transfer pulse TX is then applied to the transfer transistor 54 to allow charge from the photodiode 52 to flow into the circuit 302. After the pixel is reset, the pixel level is sampled prior to charge transfer and after charge transfer to obtain the reset pixel level and the pixel output level on the second semiconductor trace, VPIX2.

A timing embodiment for configuring circuit 302 to introduce a low-conversion gain (FIG. 4B) starts with initially setting the switches 318, 320 (e.g., switch 318 set in a first position to connect power source 304 to first connection region via the first semiconductor trace (VPIX1) and switch 320 is set in a second position to connect power source 304 to the second connection region via the second semiconductor trace (VPIX2)). The selection transistor 60 is then activated with a row selection (RS) signal being set to a high value. A reset pulse (RST) is then applied to the reset transistor 56. After the reset pulse (RST) is applied, the first switch 318 is switched to the second position to connect current bias source to the first connection region 311a. A transmit pulse TX is then applied to the transfer transistor 54 to allow charge from the photodiode 52 to flow into the circuit 302. After the pixel is reset, the pixel level is sampled prior to charge transfer and after charge transfer to obtain the reset pixel level and the pixel output level on the first semiconductor trace, VPIX1.

Figure 5:
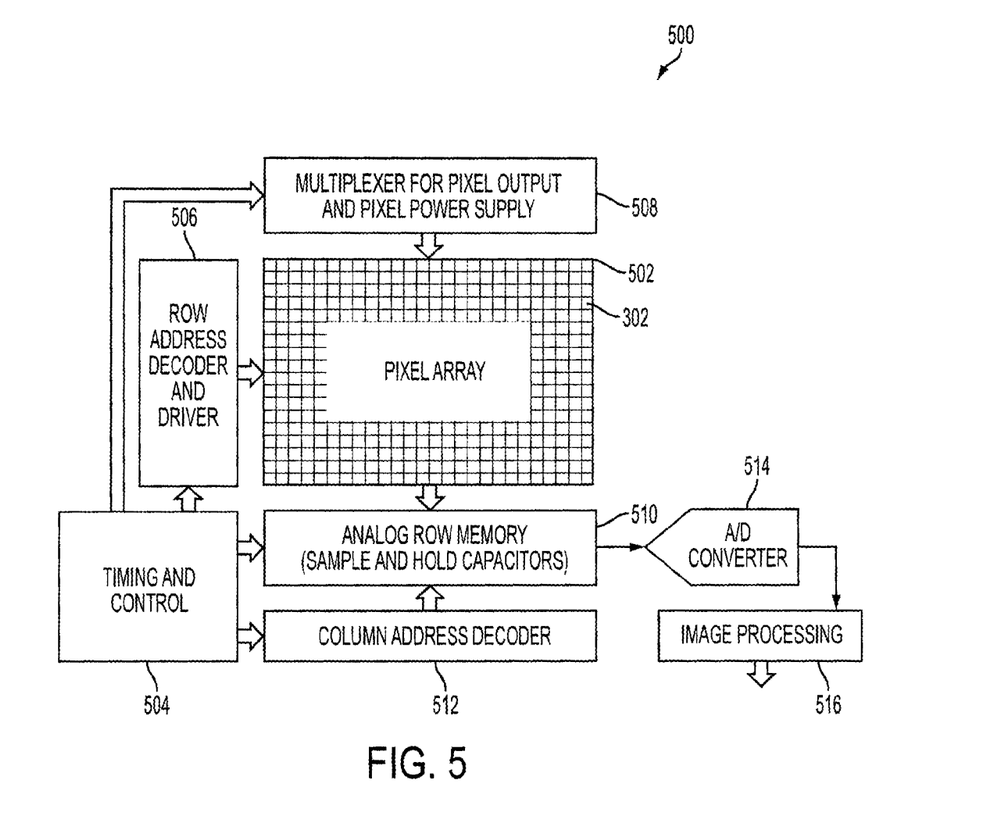
FIG. 5 is a block diagram of an imaging device in accordance with an aspect of the present invention.

FIG. 5 depicts a control circuit 500 for configuring a pixel array 502 of pixels 302. A timing and control circuit 504 provides timing and control signals for enabling the reading out of signals from pixels of the pixel array 502, e.g., by implementing the timing described above with reference to FIGS. 3B and 4B. The pixel array 502 has dimensions of M rows by N columns of pixels, with the size of the pixel array 502 depending on a particular application.

Signals from the pixel array 502 are typically read out a row at a time using a column parallel readout architecture. The timing and control circuit 504 selects a particular row of pixels in the pixel array 302 by controlling the operation of a row address decoder and driver circuit 506. A multiplexer 508 selectively couples trace lines extending through the pixel array 302 to a power source (VAAPIX) and a current bias source (IVLN) under control of timing and control circuit 504. Signals stored in the selected row of pixels are provided to a row memory 510. The signals read from each of the columns are then read out sequentially or in parallel using a column address decoder circuit 512. The pixel signals corresponding to the reset pixel signal and image pixel signal are provided as outputs of the row memory 510 are typically subtracted in a differential amplifier (not shown) and the result digitized by an analog to digital converter 514 to provide a digital pixel signal. The digital pixel signals represent an image captured by pixel array 502, which are processed by an image processing circuit 516 to provide an output image.

Figure 6:
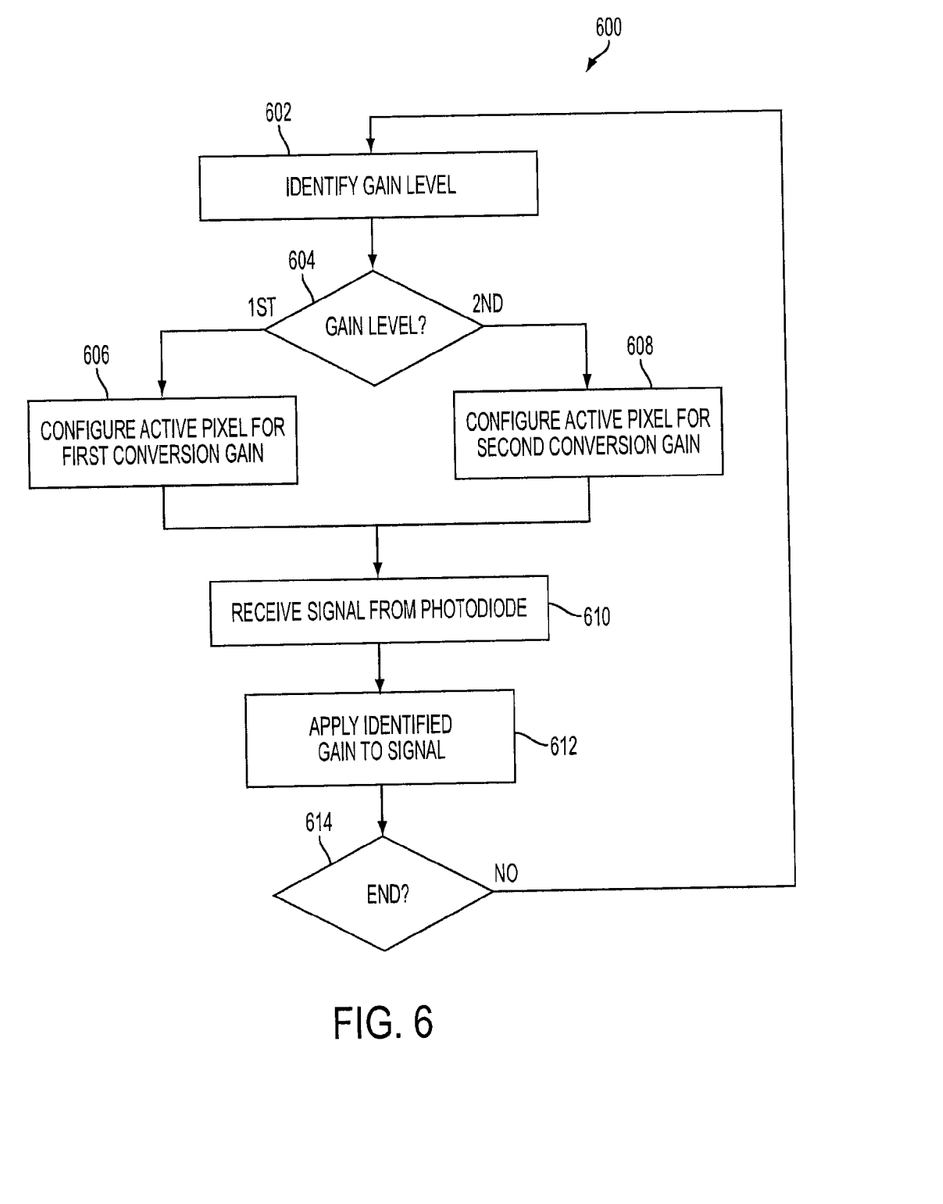
FIG. 6 is a flow chart of steps for configuring and reconfiguring the active pixel of FIGS. 3 and 4.

FIG. 6 depicts a flow chart 600 of steps for configuring the pixel 302 (FIGS. 3 and 4). The flow chart 600 is described with reference to FIGS. 3, 3A, 3B, 4, 4A, 4B, and 5 to facilitate description.

At step 602, a gain level for pixels 302 in pixel array 502 is determined. The gain level may be manually set by a user or automatically set, e.g., based on ambient light conditions. The gain level may specify a first gain level (e.g., a high-conversion gain level) or a second gain level (e.g., a low-conversion gain level).

At step 604, a decision is made regarding the identified gain level. If the gain level is the first gain level, processing proceeds at step 606. If the gain level is the second gain level, processing proceeds at step 608.

At step 606, the active pixel 302 is configured to introduce the first gain level such as illustrated in FIG. 3A. At step 608, the active pixel 302 is alternatively configured to introduce the second gain level such as illustrated in FIG. 4B. The pixel 302 may be configured to introduce the first and second gain levels by the timing and control circuit 504 in accordance with the timing diagrams depicted in FIGS. 3B and 4B, respectively. Thus, the pixel can be configured to introduce a first gain level and later reconfigured to produce a second gain level and vice versa.

When configured for high conversion gain, the equivalent floating diffusion capacitance (CFD_EQ) of capacitor 310 can be expressed:

$$CFD\_EQ=CFD\_INT+(1-GSF)\cdot CC \quad (1)$$

and the pixel conversion gain (CG) can be expressed:

$$CG=qe/CFD\_EQ, \quad (2)$$

where qe is the elementary charge, e.g., absolute charge of a single electron.

In this embodiment, utilizing a source follower transistor as the conversion transistor 38 and a floating diffusion (FD) region as the storage node N, the conversion gain ratio is limited by the gain of the pixel source follower transistor (GSF), which is typically slightly lower than 1.0 (e.g., 0.85), and the output impedance of the pixel source follower (SF) increases when the capacitor is connected between the pixel floating diffusion and pixel output nodes (high conversion gain). The influence from the pixel capacitor CC is suppressed by the voltage gain in the pixel SF transistor (GSF). The capacitance CFD_INT represents the intrinsic FD capacitance in the pixel.

When configured for low conversion gain, the node VPIX2 is connected to the power supply (VAAPIX) through MUX2. The node VPIX1 is connected to the power supply when RST is asserted (in order to reset the FD node) and then connected to the current bias source (IVLN). In this configuration, the node VPIX1 is interpreted as the pixel output signal. The pixel capacitor is now connected between the FD node and the power supply and the equivalent floating diffusion capacitance (CFD_EQ) can be expressed:

$$CFD\_EQ=CFD\_INT+CC \quad (3)$$

and the pixel conversion gain (CG) can be expressed:

$$CG=qe/CFD\_EQ, \quad (4)$$

where qe is the elementary charge, e.g., absolute charge of a single electron.

At step 610, a signal is received from a photodiode 52. In an embodiment, timing and control circuit 504 may send a transfer signal (TX) to transfer transistor 54 of pixel 302 in accordance with timing diagrams depicted in FIGS. 3B and 4B.

At step 612, the identified gain is applied to the signal transferred from the photo diode 52.

At step 614, a decision is made regarding further processing. If the decision is to proceed with further processing, processing resumes at step 602. Otherwise processing ends.

Figure 7:
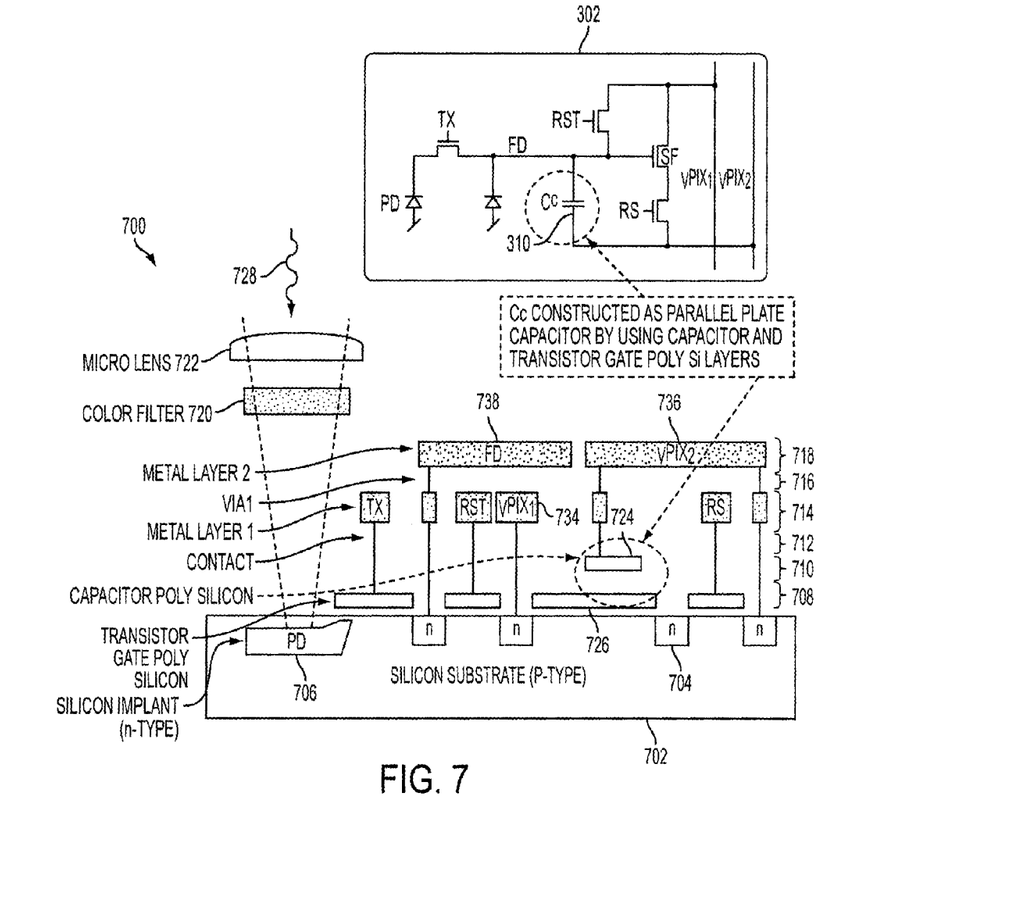
FIG. 7 is an illustrative drawing of the circuit of FIGS. 3 and 4 implemented in a front side illuminated active semiconductor pixel in accordance with an aspect of the present invention.

FIG. 7 depicts a semiconductor circuit 700 implementing the pixel 302 (which is reproduced in FIG. 7 along with dotted lines identifying the structure corresponding to the capacitor 310 in the pixel 302 to facilitate description) in accordance with an embodiment. The depicted circuit 700 is a front side illuminated (FSI) pixel. The circuit is constructed on a p-type silicon substrate 702 that includes a n-type silicon implanted photo diode (PD) 706. The substrate 702 additionally has multiple n-type connection regions 704. A polycrystalline silicon transistor gate 708, a polycrystalline silicon capacitor 710, a contact 712, a first metal layer, 714, vias 716, a second metal layer 718, a color filter 720, and a microlens 722 are formed on the substrate 722. Photons 728 from an image enter the circuit 700 through the micro lens 722 and pass through the various layers to the photo diode 706, where the photons are collected. Suitable techniques for forming the various layers of circuit 700 will be understood by one of skill in the art from the description herein.

The four transistors in pixel 302 are implemented in the silicon substrate 702 and transistor gate layer 708. Connections to the transistors are made through the first and second metal layers 714, 718 and vias 716. The capacitor 310 of pixel 302 is constructed as a parallel plate capacitor with one plate formed in the transistor gate layer 708 and the other plate formed in the capacitor layer 710. A first trace (VPIX1) 734 that is selectively connected to the power source and the current bias source is in the first metal layer 714. A second trace (VPIX2) 736 that is selectively connected to the power source and the current bias source is in the second metal layer 714 along with a floating diffusion (FD) region 738.

Figure 8:
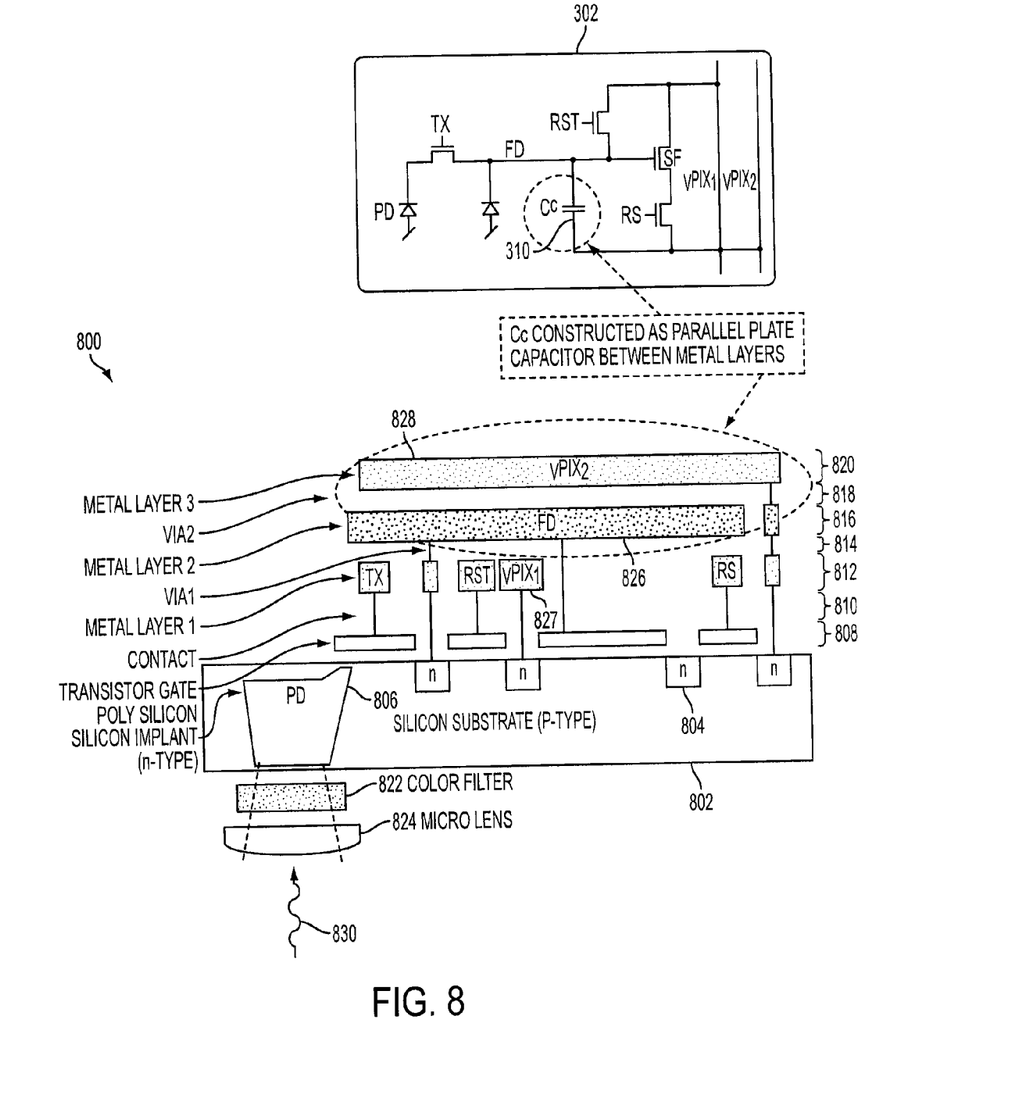
FIG. 8 is an illustrative drawing of the circuit of FIGS. 3 and 4 implemented in a backside illuminated active semiconductor pixel in accordance with an aspect of the present invention.

FIG. 8 depicts a semiconductor circuit 800 implementing the pixel 302 (which is reproduced in FIG. 8 along with dotted lines identifying the structure corresponding to the capacitor 310 in the pixel 302 to facilitate description) in accordance with an embodiment. The depicted circuit 800 is a backside illuminated (BSI) pixel. The circuit is constructed on a p-type silicon substrate 802 that includes a n-type silicon implanted photo diode (PD) 806. The substrate 702 additionally has multiple n-type connection regions 804. On one side of the substrate 802, a polycrystalline silicon transistor gate 808, a contact 810, a first metal layer 812, a first via 814, a second metal layer 816, a second via 818, and a third metal layer 820 are formed. On an opposite side of the substrate 802, a color filter 822 and a microlens 824 are formed. Photons 830 from an image enter the circuit 800 through the micro lens 824 and pass through the color filter 822 to the photo diode 806, where the photo electrons are collected. Suitable techniques for forming the various layers of circuit 800 will be understood by one of skill in the art from the description herein.

The four transistors in pixel 302 are implemented in the silicon substrate 802 and transistor gate layer 708. Connections to the transistors are made through the first, second, and third metal layers 812, 816, and 820. A first trace (VPIX1) 827 that is selectively connected to the power source and the current bias source is in the first metal layer 812. A second trace (VPIX2) 828 that is selectively connected to the power source and the current bias source is in the second metal layer 816. A floating diffusion (FD) region 826 is in the second metal layer 816. The capacitor 310 of pixel 302 is constructed as a parallel plate capacitor with one plate formed from the floating diffusion region 826 in the second metal layer 816 and the other plate formed from the second metal trace 828 in the third metal layer 820. Thus, the capacitor 310 can be implemented with minimal impact on active area within the pixel.

It will be understood by one of skill in the from the description herein that the capacitor in a front side illuminated pixel (e.g., see FIG. 7) and the capacitor in a backside illuminated pixel (e.g., see FIG. 8) can be constructed as coupling capacitance between different silicon process layers and combinations of these layers (e.g., polycrystalline silicon-polycrystalline silicon, metal-metal, etc.).

Although the invention is illustrated and described herein with reference to specific embodiments, the invention is not intended to be limited to the details shown. Rather, various modifications may be made in the details without departing from the invention.

What is claimed:

1. A pixel conversion semiconductor circuit, the circuit comprising:
   an active pixel have a storage node, a first connection region, a second connection region, a charge conversion transistor and a selection transistor connected in series between the first and second connection regions, and a capacitor connected between the storage node and the second connection region;
   a first switch coupled to the first connection region, the first switch having a first configuration that couples the first connection region to a power source and a second configuration that couples the first connection region to a current bias source; and
   a second switch coupled to the second connection region, the second switch having a first configuration that couples the second connection region to the current bias source and a second configuration that couples the second connection region to the power source.

2. The circuit of claim 1, wherein the circuit:
   produces a first conversion gain at the second connection region when the first connection region is coupled to the power source and the second connection region is coupled to the current bias source; and
   produces a second conversion gain at the first connection region that is different than the first conversion gain when the first connection region is coupled to the power source and the second connection region is coupled to the current bias source.

3. The circuit of claim 2, wherein the first conversion gain is higher than the second conversion gain.

4. The circuit of claim 1, wherein the storage node is a floating diffusion region.

5. The circuit of claim 4, further comprising:
   a photodiode that produces a signal;
   a transfer transistor coupled between the photodiode and the floating diffusion region;
   a reset transistor coupled between the floating diffusion region and the first connection region; and
   a control circuit coupled to the first switch, the second switch, the transfer transistor, the selection transistor, and the reset transistor to configure the conversion circuit to apply either the first conversion gain or the second conversion gain to the signal generated by the photodiode.

6. The circuit of claim 1, wherein the active pixel is formed using a semiconductor substrate, the circuit further comprising:
   a first trace formed on the semiconductor substrate coupling the first switch to the first connection region; and
   a second trace formed on the semiconductor substrate coupling the second switch to the second connection region.

7. The circuit of claim 6, wherein the active pixel is a front side illuminated pixel and wherein the capacitor comprises a transistor gate polycrystalline silicon layer and a capacitor polycrystalline silicon layer formed on the substrate.

8. The circuit of claim 6, wherein the active pixel is a backside illuminated active pixel and the storage node is a floating diffusion region and wherein the capacitor comprises the second metal trace and the floating diffusion region.

9. The circuit of claim 8, wherein the floating diffusion region is a third metal trace formed on the semiconductor substrate.

10. An imaging device, comprising:
    a pixel array including a plurality of active pixels, each active pixel including the circuit of claim 1.

11. The device of claim 10, wherein the imaging device is a camera.

12. The device of claim 10, wherein the pixel array is a front side illuminated (FSI) array.

13. The device of claim 10, wherein the pixel array is a backside illuminated (BSI) array.

14. A semiconductor pixel conversion gain adjustment method comprising the steps of:
    configuring an active pixel having a storage node, a first connection region, a second connection region, and a capacitor coupled between the storage node and the second connection region to introduce a first conversion gain by connecting the first connection region to a power source and connecting the second connection region to a current bias source;
    reconfiguring the active pixel to introduce a second conversion gain different than the first conversion gain by connecting the second connection region to the power source and connecting the first connection region to the current bias source.

15. The method of claim 14, further comprising the step of:
    receiving a signal from a photodiode;
    applying the first gain to the signal when the first connection region is connected to the first source and the second connection region is connected to the second source.

16. The method of claim 15, further comprising the step of:
    applying the second gain to the signal when the first connection region is connected to the second source and the second connection region is connected to the first source.

17. The method of claim 14, wherein the active pixel includes a charge conversion transistor and a selection transistor connected in series between the first and second connection regions, a first switch coupled between the active pixel and the power source, and a second switch coupled between the active pixel and the current bias source, and wherein the configuring step comprises:
  turning on the selection transistor;
  configuring the first switch in a first position to connect the first connection region to the power source;
  configuring the second switch in a first position to connect the second connection region to the current bias source;
  pulsing the reset transistor;
  pulsing the transfer transistor; and
  obtaining an output value at the second connection region after the transfer transistor pulse.

18. The method of claim 17, wherein the reconfiguring step comprises:
  turning on the selection transistor;
  pulsing the reset transistor;
  configuring the first switch in the first position prior to the reset transistor pulse;
  configuring the first switch in a second position after the reset transistor pulse to connect the first connection region to the current bias source;
  configuring the second switch in a second position to connect the second connection region to the power source;
  pulsing the transfer transistor;
  obtaining an output value after the transfer transistor pulse.

\* \* \* \* \*